Feb. 6, 1968 N. E. HOFFMAN 3,368,115

MODULAR HOUSING FOR INTEGRATED CIRCUIT STRUCTURE WITH IMPROVED INTERCONNECTION MEANS

Filed Oct. 19, 1965 6 Sheets-Sheet 2

Feb. 6, 1968 N. E. HOFFMAN 3,368,115

MODULAR HOUSING FOR INTEGRATED CIRCUIT STRUCTURE WITH IMPROVED INTERCONNECTION MEANS

Filed Oct. 19, 1965 6 Sheets-Sheet 5

3,368,115

MODULAR HOUSING FOR INTEGRATED CIRCUIT STRUCTURE WITH IMPROVED INTERCONNECTION MEANS

Norman Edwin Hoffman, Harrisburg, Pa., assignor to AMP Incorporated, Harrisburg, Pa.

Filed Oct. 19, 1965, Ser. No. 497,758
10 Claims. (Cl. 317—101)

ABSTRACT OF THE DISCLOSURE

Interconnection system for electrical components comprises spaced-apart component card connectors. A plurality of component cards extend between the card connectors and are received in the card connectors so that the conductors on the component cards engage contacts in the card connectors. Means are provided for making connections between contacts in the two card connectors thereby to interconnect the components mounted on the cards.

This invention relates to interconnection systems for electrical components and/or integrated circuit devices.

The advent of micro-miniature components and extremely small integrated circuit devices has given rise to a need for correspondingly small interconnection systems which occupy a volume of space commensurate with the size of the circuit devices themselves. A principal advantage of integrated circuits and micro-miniature devices is, of course, their extremely small size and the interconnection system for these types of circuit devices must thus be of a size which matches the size of the circuit devices themselves. Most prior art interconnection systems, which were devised with relatively larger circuit devices and components in mind, are not suited for use with micro-miniature devices and integrated circuits for the reason that a large volume of space is required for the interconnection systems and the high density advantage of the circuit devices would be lost if these prior art interconnection systems were used.

An object of the present invention is to provide an improved interconnection system for electrical components and integrated circuit devices. A further object is to provide a maintainable module-type interconnection system in which replacement of individual modules, or parts of modules, can be effected with rapidity and ease. A further object is to provide a system which permits the establishment of a maximum number of circuit paths between individual circuit components and between individual groups of circuit components. A further object is to provide a system in which the necessary circuit paths can be established by a simple drilling operation with a program-controlled drilling apparatus.

These and other objects of the invention are achieved in a preferred embodiment comprising a plurality of circuit boards, a pair of spaced-apart circuit board connectors, and an interconnecting panel member which is wrapped around the circuit board connectors. The individual circuit boards, on which the circuit units or components are mounted, are contained between the spaced-apart circuit board connectors with the planes of the board extending transversely of the planes of the connectors. The boards themselves have conductors extending to their edges to provide contact areas which are engaged by feed-through contact members in the board connectors. The interconnecting panel member is provided with a multiplicity of circuit paths thereon which also have contact surfaces which are in electrical contact with the feed-through contacts. Interconnections between different boards of the module can thus be established by way of an edge contact on a first board which engages a feed-through contact in one of the board connectors which, in turn, engages conductors on the interconnecting panel. This conductor on the interconnecting panel would extend to a second feed-through contact which, in turn, would engage an edge contact on the second board. The entire assembly is advantageously mounted in a metallic housing and the input signals are led to the module by an input connector which is disposed against a portion of the board connector and which has contact members in engagement with the conductors of the panel member.

Figure 1:
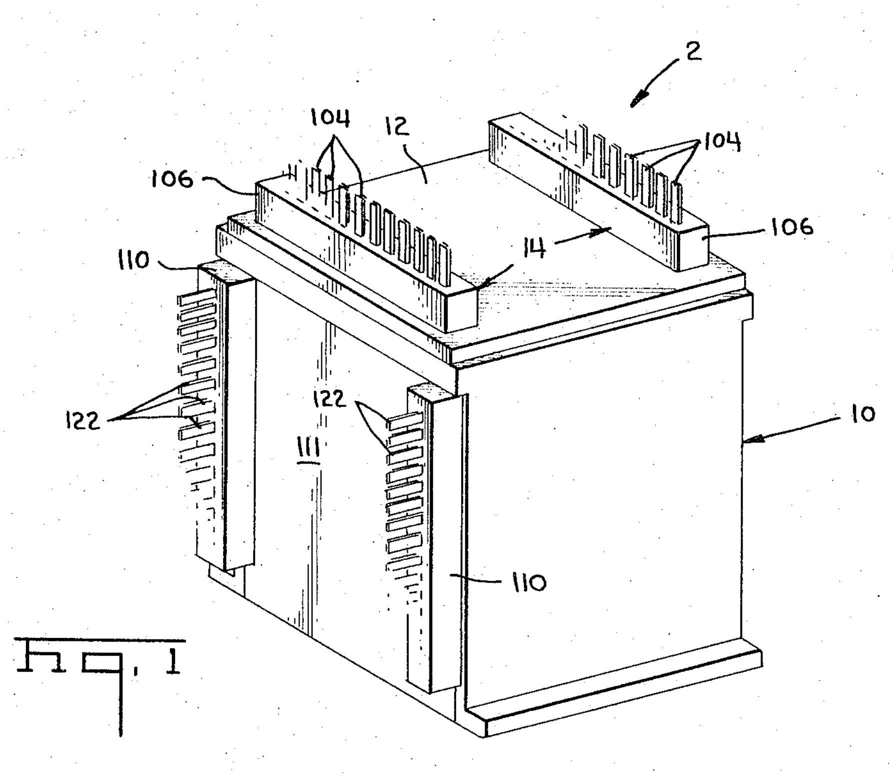
FIGURE 1 is a perspective view of a preferred form of module in accordance with the invention.
Figure 2:
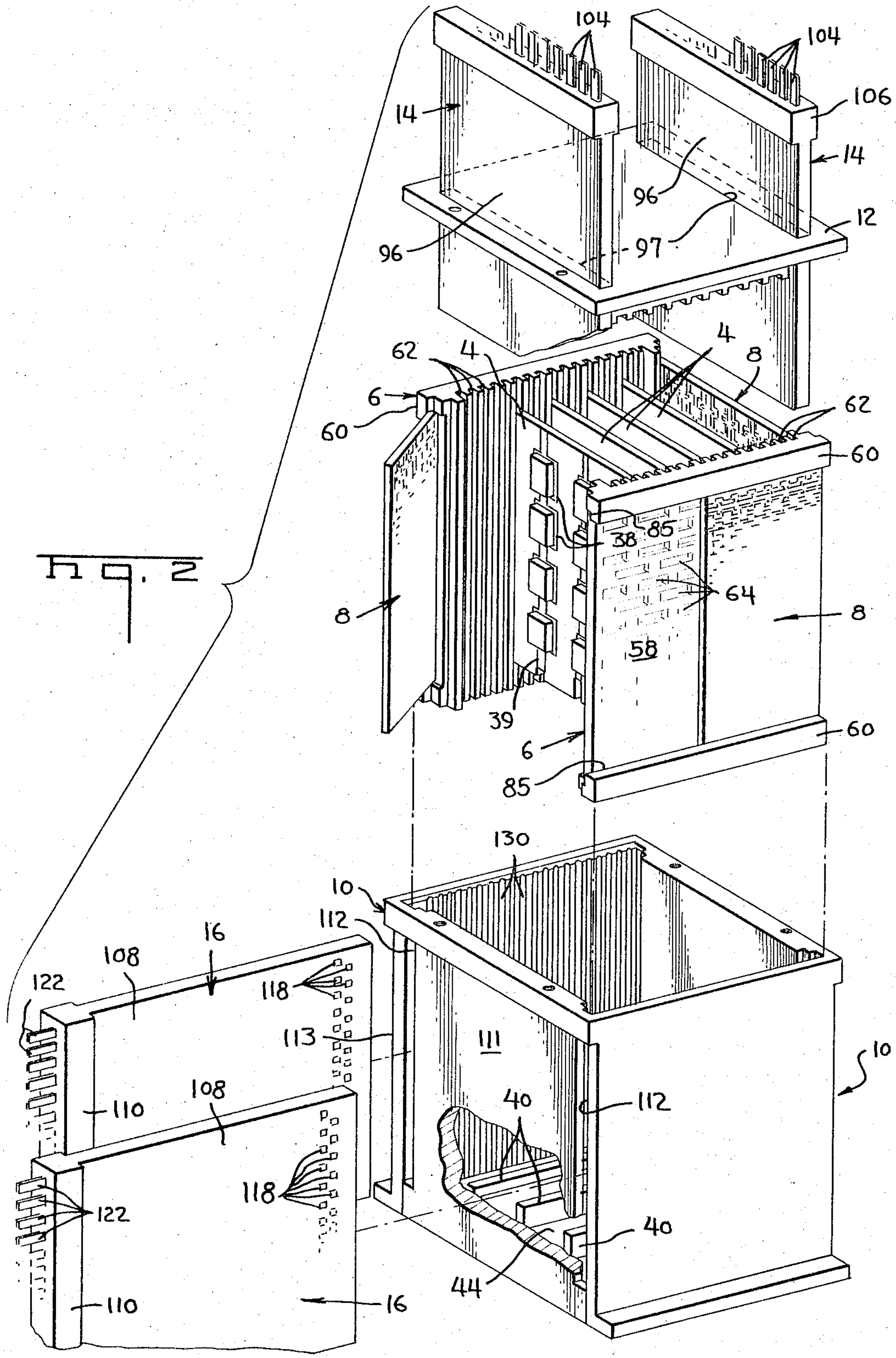
FIGURE 2 is an exploded view of the module of FIGURE 1 showing the component parts thereof.

Referring first to FIGURES 1 and 2, a preferred form of circuit unit or module 2 in accordance with the invention comprises a plurality of component boards 4, a pair of parallel spaced-apart component board connectors 6, an interconnecting panel 8 which is wrapped around the board connectors and a housing 10 within which the module is contained. This housing is provided with a lid or cover 12 having a slot therein which is adapted to receive input connectors 14 by means of which the input signals are led to the module. Additionally, the side 111 of the housing is provided with slots 112 on one of its sides which are adapted to receive monitor connectors 16 which are used to test the circuitry of the module.

The individual component boards 4 are described and claimed in my co-pending application, Ser. No. 497,657, filed Oct. 19, 1965, for Circuit Board and need not be described in complete detail here. However, a brief description of the structure of these boards is presented below as background information for an understanding of the instant invention.

Figures 3, 4:
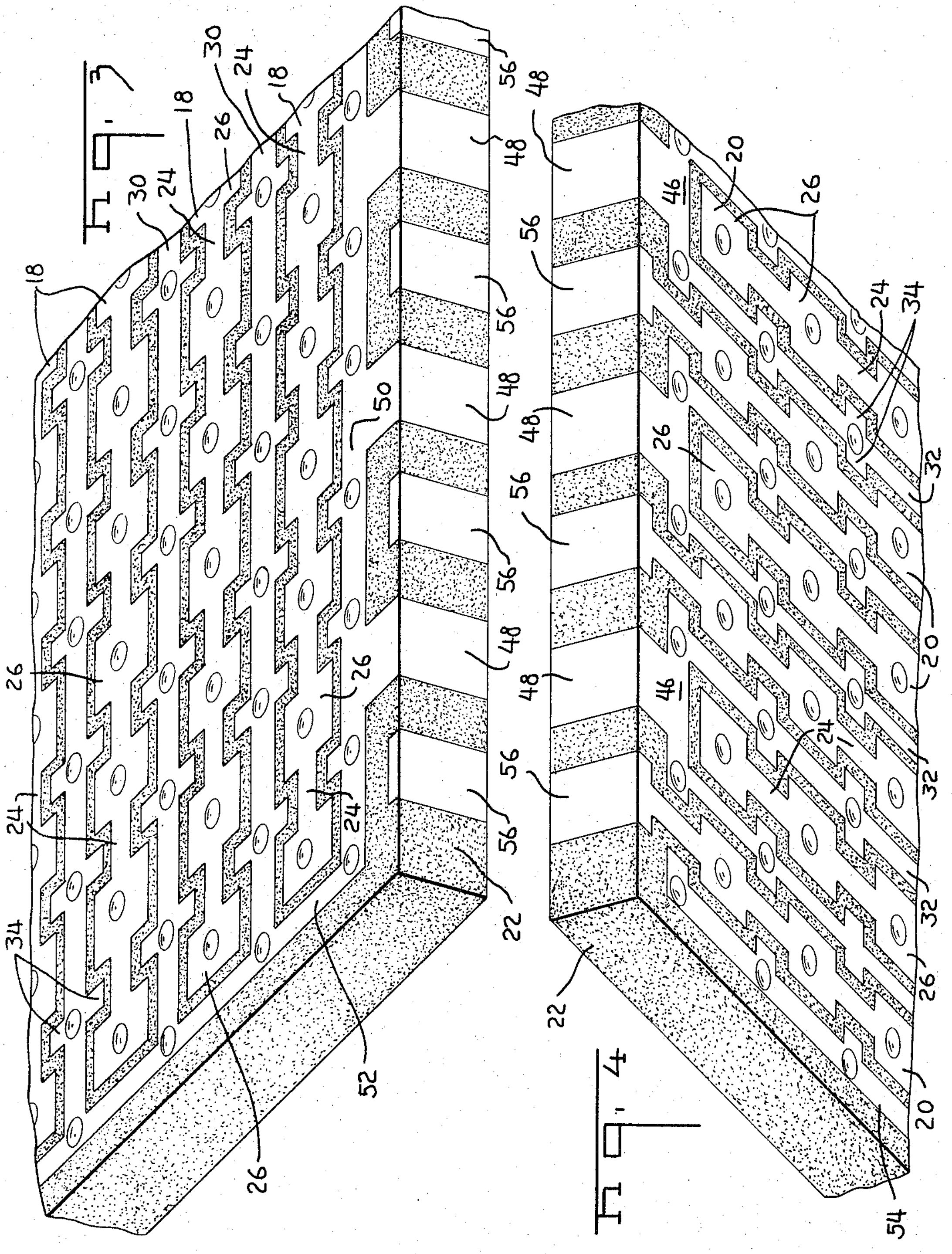
FIGURE 3 is a perspective view of a corner portion of a circuit board used in a preferred embodiment of the invention, this view showing the board oriented in a manner such that its upper surface is visible.
FIGURE 4 is a view similar to FIGURE 3 but with the board oriented such that its underside is visible.
Figures 5, 8:
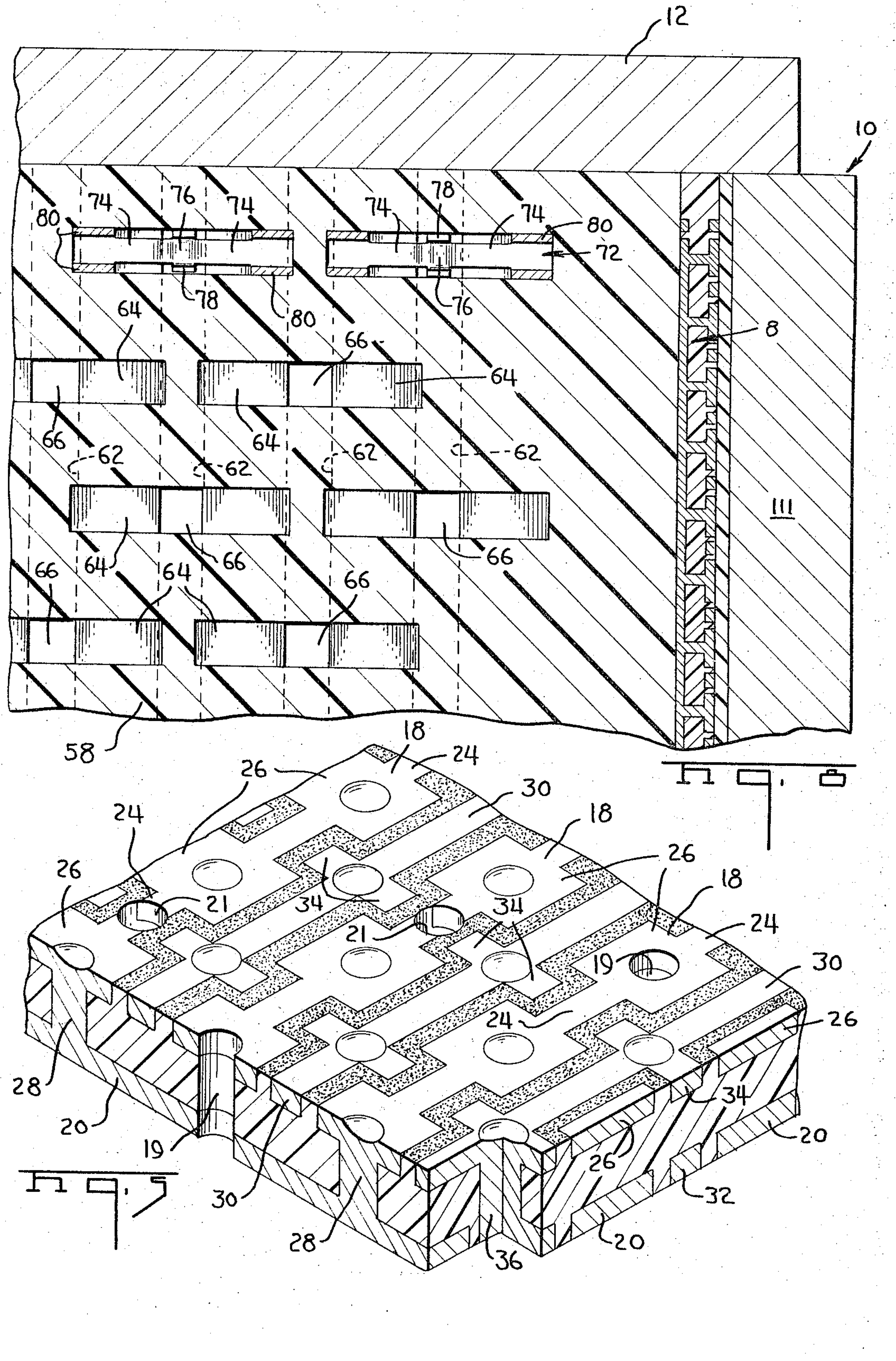
FIGURE 5 is a fragmentary perspective view showing a central portion of the board remote from the edges thereof.
FIGURE 8 is a view taken along the lines 8—8 of FIGURE 7.

As shown in FIGURES 3–5, these individual boards comprise an insulating matrix 22 having a first plurality of signal conductors 18 on one side and a second plurality of conductors 20 on the reverse side, the conductors 18 extending transversely of the conductors 20 to provide a conducting grid system in the insulating matrix. The individual conductors 18, 20 each comprise a plurality of relatively wide pad sections 26 which are joined to each other by narrow neck portions 24, the pad portions 26 of the conductors 18 being in registry with the corresponding pad portions of the conductors 20.

Conducting pipes 28 extend through the board and are integral at their ends to the registered pad portions 26 of the cnoductors, the diameter of these pipes being substantially equal to the width of the neck portions 24 of the conductors 18, 20. Specific circuit paths on the board are achieved by merely drilling through selected ones of the pipes 28 or through selected neck portions 24 of the conductors 18, 20 as shown at 19 and 21 respectively in FIGURE 5. These drilling operations may be carried out by a program-controlled drilling machine so that specific circuits or circuit arrangements can be achieved rapidly and with a high degree of accuracy.

In my preferred embodiment, I provide shielding conductors 30 and 32 on the two sides of the board extending parallel to the signal conductors 18, 20 and separating adjacent signal conductors. These shielding conductors have laterally extending spurs 34 which project towards the neck portions 24 of the signal conductors and which function as impedance compensating devices as more fully explained in application, Ser. No. 497,657, filed Oct. 19, 1965, for Circuit Board. The shielding conductors 30, 32 are also connected to each other by pipes 36 extending through the board at the spurs 34. One reason for providing these pipes 36 is that whenever a hole is drilled in one of the neck portions of the signal conductors 18, 20, the hole will extend through a shielding conductor on the opposite sides of the board. Such a hole drilled through a shielding conductor would thus interrupt the continuity of these conductors but such interruptions do not serious impair their shielding function so long as they are connected by numerous pipes as indicated at 36.

A plurality of component mounting areas 38 are provided on one side of the board, these mounting areas forming part of continuous metallic heat-conducting paths 39 which extend between two opposite edges of the board and which are isolated from the signal conductors by the insulating matrix. Again, specific details of this mounting arrangement are disclosed in my co-pending application. For purposes of the instant disclosure it should be noted that these continuous metallic paths extend to the edges of the board where they make contact with ribs 40 on the floor 44 of the housing 10. By virtue of this arrangement, heat generated by the individual components or integrated circuits is conveyed from the boards to the housing 10 and can be dissipated to the atmosphere by the relatively large surface area of the housing.

As shown best in FIGURE 4, alternate ones of the signal conductors 20 extend to the edges of the board to form contact areas 56. These contact areas are contacted by feed-through contacts 72 (FIGURE 6) mounted in the board connectors 4 and will be described below. Adjacent pairs of shielding conductors 32 on the underside of the board are joined at their ends as shown at 46 and extend to the edge of the board as shown at 48. These metallic edge portions 48 are provided primarily for the purpose of shielding the signal conductors 20 at the edges of the board. On the upper side of the board, the metallic edge portions 48 of the shielding conductors merge with a shielding conductor 50 which extends around the board edges as shown at 52. An edge shielding conductor is provided on the left on the underside of the board as shown at 54 which is connected by pipes to shielding conductor 52 as indicated in FIGURES 3 and 4.

Figure 6:
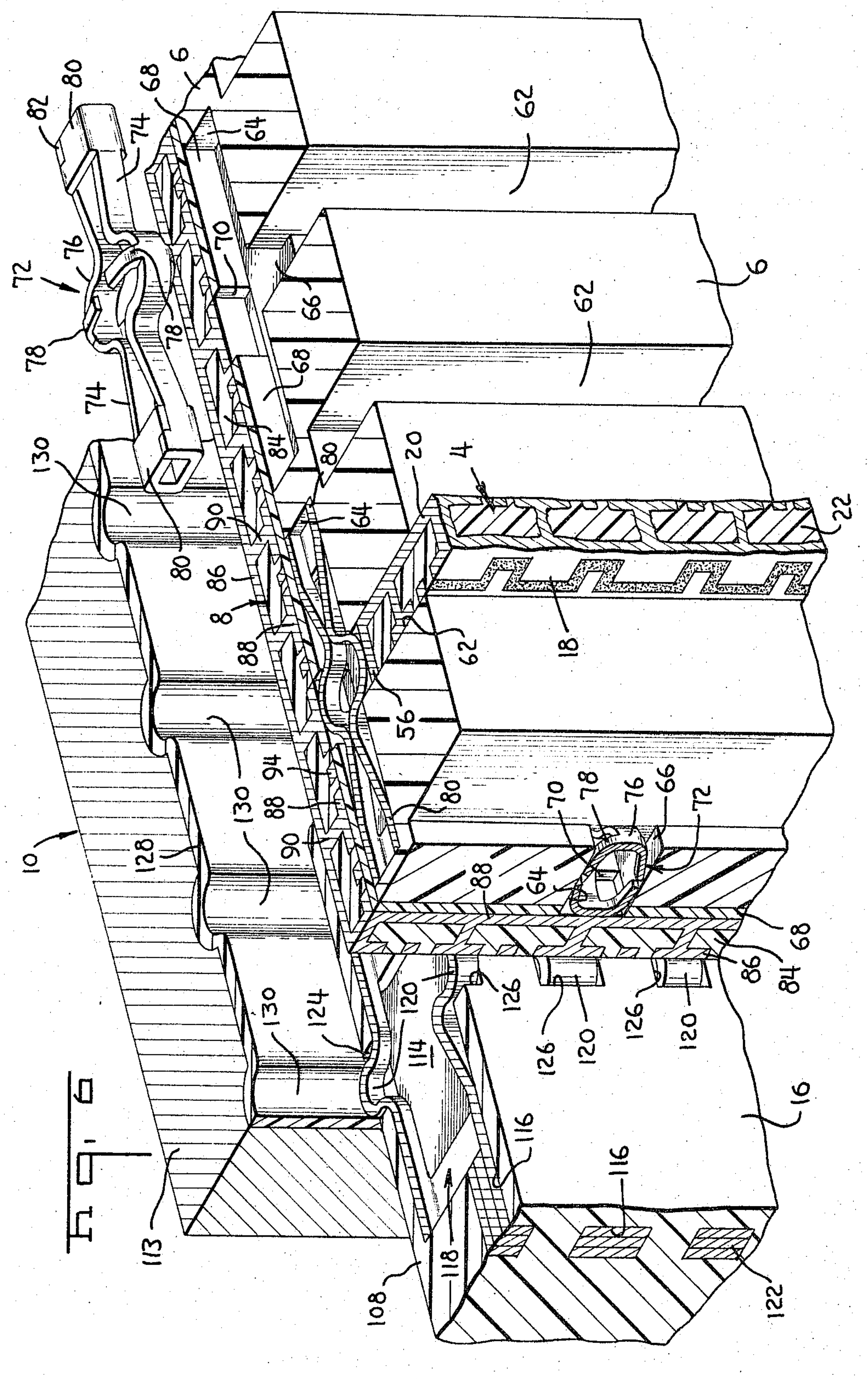
FIGURE 6 is a fragmentary perspective view showing portions of a circuit board, a circuit board connector, the interconnecting panel, a monitor connector, and the housing and illustrating the relationship of these parts to each other in the assembled module.

The component board connectors 6 each comprise a flat panel-like section 58 having relatively heavy sectioned flanges 60 on its opposite edges. A plurality of spaced-apart parallel slots 62 extend between the flanges 60 on one side of the panel portion 58, the width of these slots conforming to the thickness of the individual boards so that the boards can be slid into the corresponding slots of the connectors as shown in FIGURES 2 and 6. A plurality of recesses 64 are provided on the outwardly facing sides of the panel portions 58 and intersect the slots 62 as shown at 66. In the disclosed embodiment, the recesses 64 are arranged in a staggered pattern as shown in FIGURE 8 to achieve maximum density of contacts with the edges of the individual boards. Cover plates 68 are mounted against the outwardly facing sides of the panel portions 58 and have relatively small openings 70 therein which are in alignment with the openings 66 in the slot 62.

Figure 7:
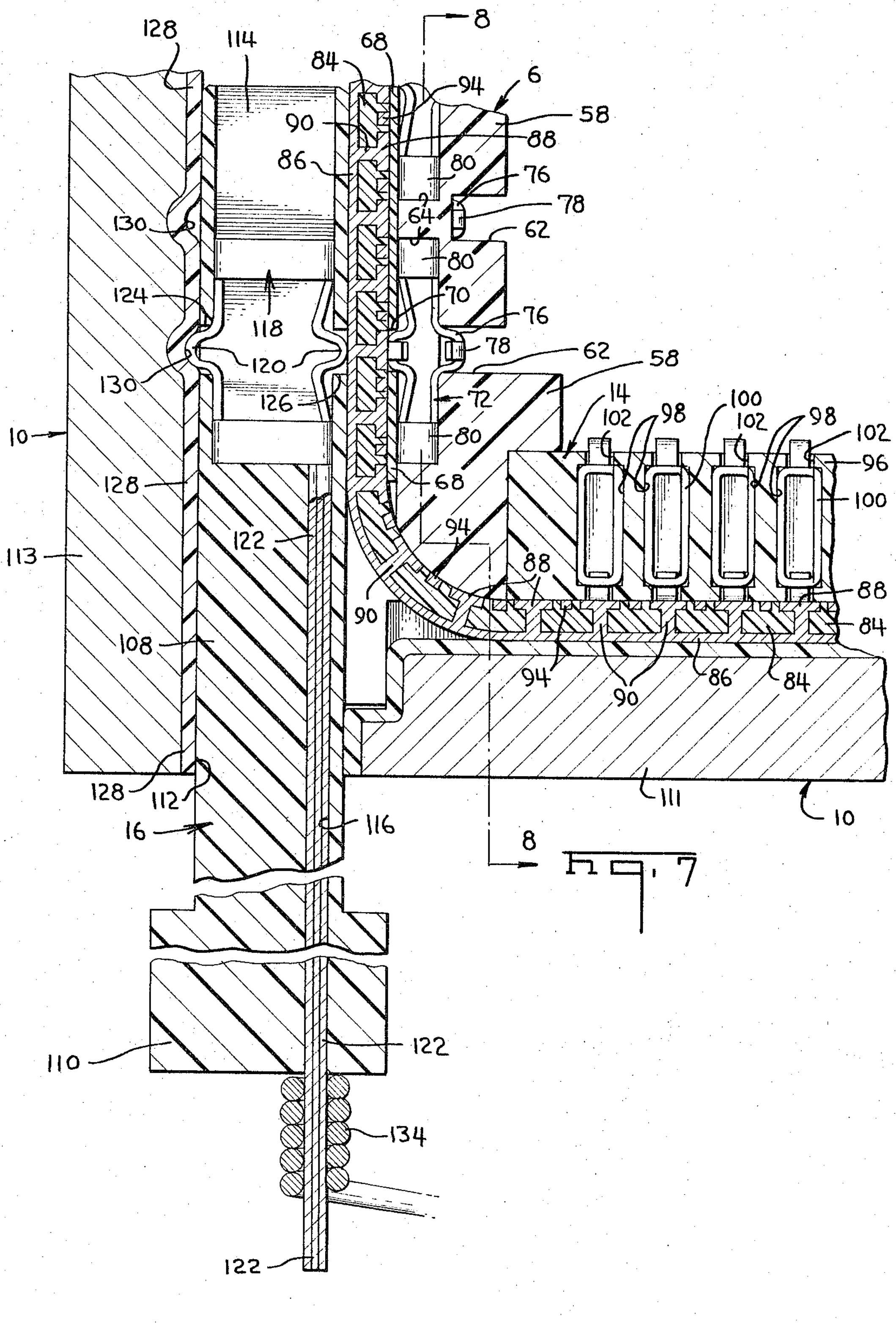
FIGURE 7 is a fragmentary sectional view taken through a corner of the module in FIGURE 1 looking downwardly.

Feed-through contacts 72 are mounted in the recesses 64, these contacts each comprising a pair of parallel spaced-apart arms 74 which are outwardly bowed at opposite directions intermediate their ends as shown at 76. The edges of the bowed portions of the arms are formed inwardly to provide a curved surface as shown at 78 to permit the boards to be slid over the contacts when they are inserted into the slots 62 of the connectors as is evident from FIGURE 7. When a contact is mounted in an individual recess 64, the bowed portion 76 of one arm will project through the associated opening 66 and engage a contact portion 56 of the associated board. The bowed portion of the other arm will project through the corresponding opening 70 of the cover plate 68 and engage a conductor in the interconnecting panel 8 as will be described below. The ends of the arms 74 have laterally extending flanges which are shaped to form rectangular frames as shown at 80 with the ends interlocked as shown at 82. The contact shown thus provides a pair of beams anchored at their ends which are relatively stiff and which are capable of developing the desired contact pressure in spite of their small size.

The interconnecting panel member 8 is in many respects similar to the individual boards 4 and comprises an insulating matrix 84 having horizontal conductors 86 on its external surface and vertical conductors 88 on its internal surface. These conductors have spaced-apart pad portions similar to the pad portions of the board conductors 18, 20 with corresponding pad portions of the conductors 86, 88 being joined by pipes 90 extending through the insulating matrix 84. This insulating matrix in the disclosed embodiment is of a flexible plastic material so that it can be wrapped around the board connectors, for example, this insulating matrix may be of polytetrafluoroethylene or polyphenylene oxide, both of which have good high temperature properties and both of which can be made relatively flexible. The edges of the interconnecting panel are received in slots 85 (FIGURE 2) in the flange portions 60 of the board connectors 6 in order to hold the panel in position. As with the individual boards, individual shielding conductors 94 are provided beside the signal conductors 86, 88, these shielding conductors being similar in most respects to the shielding conductors 30, 32 of the individual boards. It will be noted that the interconnecting panel does not have component mounting surfaces as does the board since this panel functions only to provide conducting paths between the boards mounted in the board connectors 6.

As with the individual component boards, the desired circuit paths in the interconnecting panel are achieved by merely drilling out suitable portions of the conductors 86, 88 and/or selected ones of the pipes 90. Thus, it will be apparent that a conducting path can be established from either side of any one of the boards to either side of any other one of the boards by way of the edge contacts of the two boards, the feedthrough contacts 72 in the connectors and an indivdiual conductor in the interconnecting panel.

Figure 9:
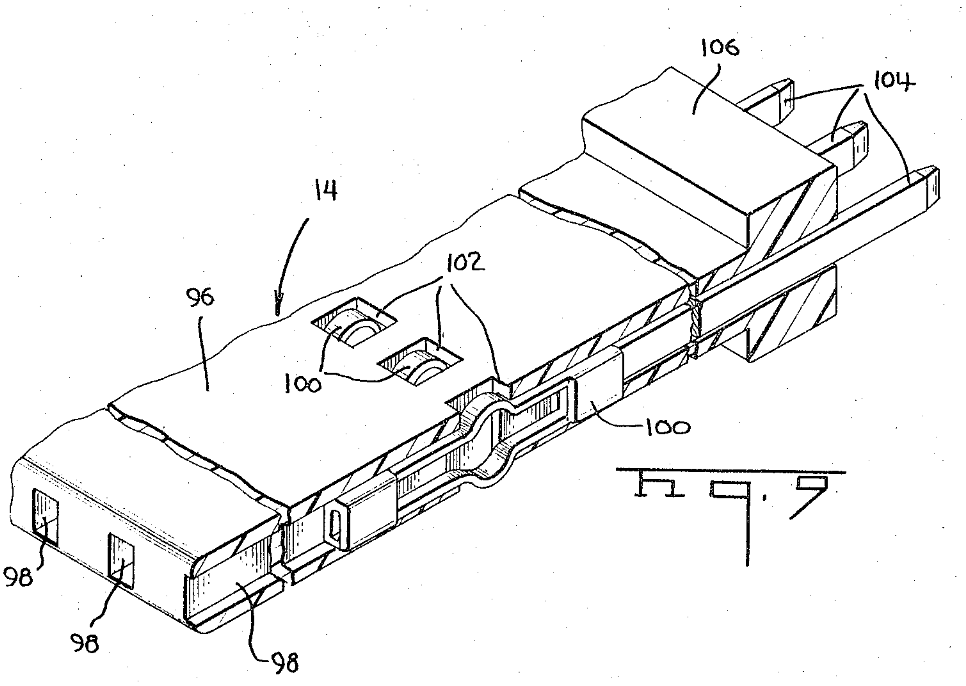
FIGURE 9 is a perspective view of an input connector used in the disclosed embodiment.

The inputs (signals or the power inputs) for the module are introduced through the pad portions of the conductors on the interconnecting panel 8 by means of input connectors 14, FIGURE 9, which are inserted through slots 97 in the housing cap 12. The portions of the interconnecting panel 8 which extend between corresponding sides of the board connectors 6 have exposed internal surfaces and the input connector 14 is adapted to be moved through slot 97 so that it will be positioned against this surface. This connector comprises an insulating block 96 having an enlarged upper end 106 and a plurality of parallel cavities 98 within which contacts 100 are mounted. These contacts are substantially similar to the contacts 72 but differ therefrom in that they are provided with post extensions 104 which project beyond the enlarged end 106 of the connector. The bowed intermediate portions of the arms of the contacts 100 extend through openings 102 and the sides of the connector so that when the connector is inserted through the slot 97, these bowed portions will contact individual pad portions of the conductors 88 of the interconnecting panel. It is understood that the input signals are led by conductors suitably connected to the posts 104 as, for example, by clip-type or wrap-type electrical connections.

The monitor connectors 16 are similar, in many respects, to the input connectors 14. Thus, each monitor connector comprises a flat panel-like portion 108 having an enlarged head 110 extending along one edge thereof. These connectors are adapted to be inserted through slots extending along the edges of the side 111 of the housing so that the panel-like portion 108 of each monitor connector will be disposed between the internal surface of the side 113 of the housing and the outwardly facing surface of the interconnecting panel 8.

A plurality of cavities 114 extend inwardly of the upper edge of the monitor connector panel portion 108 and passageways of reduced cross-section 116 extend from each of these cavities for the full length of the panel portion 108 to the enlarged head 110. Contacts 118, similar to the contacts 100, are positioned in these cavities and have outwardly bowed arm portions 120 which project through openings 124 in the panel portion 108. The internal surfaces of the housing sidewalls 113 are provided with coverings of suitable plastic insulating material 128 and vertically extending grooves 130 are located in these panels and in the housing sidewalls in alignment with each of the slots 62 of the board connectors 6. It will be noted that the contacts 118 are staggered adjacent to the end of the panel portion 108 and that the contact arms 122 extend for the full length of the panel portion and emerge through the head portion or enlarged portion 110. Suitable external connections, as shown at 134, to these projecting ends extend to test instruments of any suitable type to test the individual circuit boards as will be described below. The contact arms are of a triple thickness of metal since the contacts themselves are formed of relatively thin sheet metal and the triple thickness results in a sufficiently stiff arm.

In order to test the individual circuit boards, the monitor connectors 16 are inserted to the full depth permitted. At this location, the projecting bowed portions of the contacts will extend through the openings 124 to latch the monitor connector in alignment with the endmost board. The other contact sections extend through the openings 126 and contact pad sections of the conductors 86. The performance and operability of the individual board which is in alignment with the monitor contacts can then be determined from the test instruments being used. The next adjacent board and the remaining boards in the module can then be similarly tested; that is, by moving the monitor connector to the successive channels or grooves 130 at which locations the contacts in the monitor connector will be in electrical contact with the selected ones of the horizontal conductors 86 of the interconnecting panel 8 which are, in turn, in contact with the contacts 72 on the connectors 6. These contacts, in turn, are in engagement with the edge contact sections of the individual circuit boards.

A salient advantage of an interconnection system in accordance with the invention is that a relatively large amount of circuitry can be packaged in an extremely small volume. This advantage stems, in part at least, from the fact that the boards 4 can be mounted in relatively closely spaced relationship although a relatively large number of edge contacts are provided for each board.

The interconnecting panel 8, being wrapped around the board of the board connectors, permits the achievement of a large number of conducting paths between the boards. The conducting paths themselves, as previously noted, can be established by merely drilling the boards and the connecting panel with a suitable program-controlled drilling machine. It should also be noted that the number of electrical interfaces (the pressure contacts 72) is kept to a minimum by this drilling technique. In other words, if an individual path is established between two boards, this path will be continuous in the interconnecting panel 8 and in the two boards involved and will involve interfaces only at the feed-through contacts in the connectors 6.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

I claim:

1. An electrical interconnecting system comprising, a pair of spaced-apart component card connectors, a plurality of component cards extending between said card connectors and having opposite edge portions engaged by said card connectors, feed-through contact means in said component card connectors, said feed-through contact means contacting edge portions of said component cards, and interconnecting panel means surrounding said connectors, said panel means having interconnecting conductors thereon, said feed-through contact means contacting said interconnecting conductors whereby said cards are interconnected.

2. An interconnecting system as set forth in claim 1 including a housing, said card connectors, said component cards, and said interconnecting panel means being contained in said housing, and an input connector insertable through said housing, said input connector having means for contacting said interconnecting conductors on said interconnecting panel thereby to provide external connections to said system.

3. An interconnecting system as set forth in claim 1 including a housing, said card connectors, said component cards, and said interconnecting panel means being contained in said housing, and a monitor connector insertable through said housing, said monitor connector having means for contacting said interconnecting conductors which are in contact with specific ones of said cards thereby to monitor said specific cards.

4. An electrical interconnecting system comprising, a pair of parallel spaced-apart component card connectors, a plurality of parallel component cards extending between said card connectors and having opposite edge portions in engagement with said card connectors, feed-through contact means in said card connectors, said feed-through contact means contacting edge portions of said component cards, and interconnecting panel means, said panel means comprising first portions disposed against the external surfaces of said card connectors and second portions extending between corresponding edges of said connectors and parallel to said component cards, said panel means having interconnecting conductors thereon, said feed-through contacts in said card connectors being in contact with said interconnecting conductors in said first portions of said panel means thereby to interconnect said conductors on said cards.

5. An interconnecting system as set forth in claim 4 wherein said panel means comprises a continuous matrix of insulating material.

6. An interconnecting system as set forth in claim 4 wherein said panel means comprises a continuous matrix of insulating material, said interconnecting conductors comprising a first group of parallel conductors on the internal surface of said panel means which is disposed against said card connectors and which faces inwardly towards said connectors and panel cards, said first groups of conductors extending parallel to said opposite edge portions of said card connectors, and said interconnecting conductor means comprising a second group of parallel conductors on the external surface of said panel, said conductors of said second group extending normally of said conductors of said first group and extending around said connectors and cards, said conductors of said first group being electrically connected to said conductors of said second group by pipes extending through said panel and normally of its plane, at least some of said pipes having been removed to form specific circuit paths between said cards.

7. An interconnecting system as set forth in claim 6 including a housing, said panel means, said card connectors, and said cards being contained in said housing, and an input connector insertable into an opening in said housing and beside said panel means, said input connector having input contact means therein for contacting said interconnecting conductors and having means for connecting said input contact means to external conductors.

8. An electrical interconnection system for component cards adapted to have electrical components mounted thereon, each card having conductors extending from said components to opposite edges of said board, said system comprising a pair of component card connectors disposed in parallel spaced-apart relationship to each other, said cards being positioned between said connectors with their planes extending transversely of the planes of said connectors and with said opposite edges of each card in engagement with the opposed surfaces of said connectors, interconnecting panel means in surrounding relationship to said connectors, said panel means being disposed against the external sides of said connectors and extending between the corresponding edges of said connectors, conductors on said panel means, said conductors having contact surface portions on the internal surface of said panel means, contact means in said connectors to electrically connect said conductors on said cards to said contact surface portions of said panel means thereby to interconnect said conductors on said cards, at least one input connector disposed between said component card connectors and adjacent to a pair of corresponding edges of said card connectors, said input connector having a surface disposed adjacent to internal surface portions of said panel means, and contact means on said input connector in electrical contact with contact surface portions on said panel means.

9. An electrical interconnecting system comprising, a pair of spaced-apart component card connectors, a plurality of component cards extending between said card connectors and having opposite edge portions engaged by said card connectors, feed-through contact means in said component card connectors, said feed-through contact means contacting edge portions of said component cards, and interconnecting means for interconnecting the said feed-through contact means of one of said component card connectors with the feed-through contact means of the other one of said component card connectors.

10. An interconnection system as set forth in claim 9 wherein said interconnecting means comprises panel means surrounding said component card connectors, said panel means having interconnecting conductors thereon, said feed-through contact means contacting said interconnecting conductors whereby said cards are interconnected.

References Cited

UNITED STATES PATENTS 3,264,525 8/1966 Swengel et al. ______ 317—101

ROBERT K. SCHAEFER, *Primary Examiner.*

J. R. SCOTT, *Assistant Examiner.*